United States Patent
Rodmacq et al.

(10) Patent No.: US 7,813,202 B2
(45) Date of Patent: Oct. 12, 2010

(54) THIN-FILM MAGNETIC DEVICE WITH STRONG SPIN POLARIZATION PERPENDICULAR TO THE PLANE OF THE LAYERS, MAGNETIC TUNNEL JUNCTION AND SPIN VALVE USING SUCH A DEVICE

(75) Inventors: Bernard Rodmacq, Veurey Voroize (FR); Bernard Dieny, Lans En Vercors (FR)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 288 days.

(21) Appl. No.: 11/833,336

(22) Filed: Aug. 3, 2007

(65) Prior Publication Data

US 2008/0031035 A1 Feb. 7, 2008

Related U.S. Application Data

(60) Provisional application No. 60/868,429, filed on Dec. 4, 2006.

(30) Foreign Application Priority Data

Aug. 3, 2006 (FR) .................................... 0653266

(51) Int. Cl.
*G11B 5/39* (2006.01)
*G11C 7/00* (2006.01)
(52) U.S. Cl. ............. 365/209; 360/324.11; 360/324.12; 428/811.2
(58) Field of Classification Search ........................ None
See application file for complete search history.

(56) References Cited

U.S. PATENT DOCUMENTS 5,695,864 A 12/1997 Slonczewski
6,532,164 B2 * 3/2003 Redon et al. ................... 365/97

(Continued)

FOREIGN PATENT DOCUMENTS

FR 2 817 998 A1 6/2002

OTHER PUBLICATIONS

D. Ravelosna et al, *"Nanometer Scale Observation of High Efficiency Thermally Assisted Current-Driven Domain Wall Depinning,"* Physical Review Letters, The American Physical Society, vol, 95, Sep. 8, 2005, pp. 117203-1-117203-4.

*Primary Examiner*—Kevin M Bernatz
(74) *Attorney, Agent, or Firm*—Burr & Brown

(57) ABSTRACT

A thin-film magnetic device comprises, on a substrate, a composite assembly deposited by cathode sputtering and consists of a first layer made of a ferromagnetic material with a high rate of spin polarization, the magnetization of which is in plane in the absence of any electric or magnetic interaction, a second layer made of a magnetic material with high perpendicular anisotropy, the magnetization of which is outside the plane of said layer in the absence of any electric or magnetic interaction, and coupling of which with said first layer induces a decrease in the effective demagnetizing field of the entire device, a third layer that is in contact with the first layer via its interface opposite to that which is common to the second layer and made of a material that is not magnetic and not polarizing for electrons passing through the device.

16 Claims, 5 Drawing Sheets

U.S. PATENT DOCUMENTS

| | | |
|---|---|---|
| 6,835,646 B2 | 12/2004 | Fortin |
| 6,844,605 B2 | 1/2005 | Nishimura |
| 7,531,882 B2 * | 5/2009 | Nguyen et al. ............... 257/421 |
| 2002/0101692 A1 | 8/2002 | Fullerton et al. |
| 2005/0104101 A1 | 5/2005 | Sun et al. |
| 2008/0241597 A1 * | 10/2008 | Dieny et al. ............... 428/811.2 |
| 2008/0291584 A1 * | 11/2008 | Parkin ..................... 360/324.2 |

* cited by examiner

Appendix C

THIN-FILM MAGNETIC DEVICE WITH STRONG SPIN POLARIZATION PERPENDICULAR TO THE PLANE OF THE LAYERS, MAGNETIC TUNNEL JUNCTION AND SPIN VALVE USING SUCH A DEVICE

CROSS REFERENCE TO RELATED APPLICATIONS

This application claims the benefit under 35 USC §119(e) of U.S. Provisional Application Ser. No. 60/868,429, having a filing date of Dec. 4, 2006 and claims the benefit under 35 USC §119(a)-(d) of French Application No. 06.53266, filed Aug. 3, 2006, the entireties of which are incorporated herein by reference.

FIELD OF THE INVENTION

The present invention relates to the field of magnetic materials, more especially those intended to be used firstly in non-volatile random-access magnetic memories used to store and read data in electronic systems and secondly in the field of radio-frequency oscillators that use magnetic thin-film systems technology.

BACKGROUND OF THE INVENTION

In the field of magnetic memories, so-called M-RAM (Magnetic Random Access Memory) consisting of a magnetic tunnel junction have attracted considerable interest ever since the development of such tunnel junctions which have high magnetoresistance at ambient temperature. These random-access magnetic memories have many significant advantages:

speed (write and read times of just a few nanoseconds);
non-volatile;
no read/write fatigue; and
unaffected by ionising radiation.

This being so, they are increasingly replacing memory that uses more conventional technology based on the charge state of a capacitor (D-RAM, S-RAM, FLASH).

In these magnetic memories, coding of information ("0" or "1") depends on the relative orientation (parallel or antiparallel) of the magnetization of two magnetic layers having different coercivities, one of the layers being "free", i.e. having a magnetization direction that can be modified by applying an external low-intensity magnetic field and the other layer being referred to as "anchored", i.e. having a magnetization direction that is unaffected by said external magnetic field.

This change in the relative orientation of magnetization directions modifies the electrical resistance of the stack of two layers thus formed and the magnetic state is read by measuring an electric voltage after injecting an electric current in a direction that is perpendicular to the plane of the layers.

Generally speaking, information is written by sending two electrical pulses via conductors that intersect at a right angle close to the point where the memory cell in question is located. Adding the two magnetic fields created by these electrical pulses at the level of the cell and the direction of the electric currents injected makes it possible to change the magnetization direction of the "free" layer, thus writing the information in question.

However, the existence of relatively widely distributed switching fields of all the memory cells due to the method of fabrication makes it necessary, in order to ensure a change in the orientation of magnetization, to use an external magnetic field that is higher than the highest switching field of said distribution. This being so, there is a risk of inadvertently reversing certain memory cells located on the corresponding row and/or column having a switching field, possibly located in the lower part of the distribution, that is weaker than the magnetic field generated by the row or column alone.

If one wants to make sure that no memory cell can be written by one row or column alone, the write current must be limited so that it never exceeds, for these memory cells, the magnetic field that corresponds to the lower part of the distribution with the risk of not writing the selected memory cell at the intersection of said rows and columns if the switching field for that memory location is in the upper part of the distribution. In other words, this architecture with selection by magnetic fields using rows and columns of conductors can easily result in write addressing errors.

In addition, it has generally been observed that the average value of the switching field increases as the size of the memory cells decreases. This being so, a stronger electric current is required in order to ensure actual switching of the magnetization of the memory cell and this consequently entails an increase in the required electric power.

Because of this, another write technique referred to as "magnetization switching by spin-polarized current" has been proposed. This technology involves writing memory cells by using a spin-polarized electric current rather than an external magnetic field. In fact, it has been demonstrated that a spin-polarized current is capable of causing precession or even reversal of magnetization by spin angular momentum transfer between polarized carriers and the magnetic moment of the layer in question (see U.S. Pat. No. 5,695,864, for example).

One of the advantages of this technique is the fact that the same current row is used for both reading and writing the magnetic information and this simplifies the architecture of the device considerably. Thus, as it passes through the various layers of the magnetic stack in question, the electric current is polarized and the electron spin tends to align itself with the local magnetization direction. If there is no depolarization in the layers through which the current passes, this polarization is maintained in the second magnetic layer and in turn induces precession of the magnetization of the so-called "free" magnetic layer around the polarization direction.

If the electric current density increases, the angle of the precession cone increases until it eventually exceeds 90° for a certain critical current, thus causing the magnetization of the "free" layer to flip to a direction that is opposite to its initial direction.

Nevertheless, this particular technology is hampered by one serious limitation. In fact, in this configuration, in order to achieve magnetization reversal, it is necessary to overcome the demagnetizing field of said "free" layer. For thin magnetic films, this demagnetizing field tends to hold magnetization in the plane of said layer. Because this demagnetizing field is proportional to the magnetization of the material, it is obvious that magnetization reversal makes it necessary to inject a high-intensity current which is capable of damaging the device, especially by causing electric breakdown of the insulating barrier that separates the two magnetic layers in the case of a magnetic tunnel junction.

Magnetic thin-film systems are also used in the field of radio-frequency oscillators. RF oscillators have undergone considerable development directly associated with corresponding development of mobile telephony. In fact, mobile telephony has brought about the use of oscillators having a very wide frequency band with especially good jitter performance and hence a high quality factor.

One technical solution to meet this demand is to use electron-spin based radio-frequency oscillators. Using such oscillators makes it possible to obtain a wide frequency band with a high quality factor Q and straightforward frequency tunability and, moreover, to use a relatively simple architecture.

Spin polarization of an electric current which causes magnetoresistive phenomena in magnetic multilayers such as giant magnetoresistance and tunnel magnetoresistance is known. In addition, when it passes through a magnetic thin layer, such a spin-polarized current can affect the magnetization of a magnetic nanostructure by inducing reversal of its magnetization in the absence of any external magnetic field or by generating sustained magnetic excitation also referred to as oscillations. The frequency of this excitation depends, in particular, on the density of the current that flows through the nanostructure.

Using the effect of generating sustained magnetic excitation in a magnetoresistive device makes it possible to convert this effect into electrical resistance modulation that can be directly used in electronic circuits with the consequent possibility of acting at the level of frequency.

However, one of the problems encountered with these radio-frequency oscillators is the density of the spin-polarized current that has to be injected into the magnetic system in question and which is capable of causing damage to the device due to breakdown or electromigration phenomena.

Regardless of the prospective application, in order to reduce the current densities required to write information, attempts are always made to obtain a thin-layer magnetic material whose magnetization is spontaneously parallel to the plane of that layer but can easily be oriented in a perpendicular direction by the effect of a low-amplitude magnetic field (or polarized current) or a thin-layer magnetic material whose magnetization is spontaneously (without any external magnetic field or polarized current) perpendicular to the plane of that layer.

For this purpose, the reader is reminded of the physical principles that underlie these phenomena. For a single magnetic layer, i.e. for example a thin layer of magnetic material deposited on a substrate where there is no particular interaction with said layer, the form effect (the fact that the lateral dimensions of this layer are much larger than its thickness) tends to keep its magnetization direction in plane (so-called "planar" magnetization).

If a magnetic field of increasing amplitude is applied in a direction perpendicular to the plane of this layer, the direction of its magnetization will gradually exit this plane and orient itself parallel to the applied field. It will therefore be perpendicular to the plane when the applied magnetic field reaches a perpendicular saturation field value $H_{sp}$ equal to a so-called "demagnetizing field" $H_{dm}$ that is proportional to the magnetization per unit of volume $M_s$ of this magnetic material in accordance with the following equation:

$$H_{sp}=H_{dm}=4\pi M_s.$$

To give some idea of values, this field $H_{sp}$ is of the order of 18 kilo-oersteds (kOe) for a material such as cobalt and 6 kOe for nickel. The first way of reducing this field $H_{sp}$ is therefore to use a weakly magnetic material. However, this may be disadvantageous for some applications in which the wanted signal depends on this magnetization.

A second way of reducing $H_{sp}$ is to introduce an additional term of opposite sign to $H_{dm}$. This so-called "perpendicular anisotropy" term $H_{ap}$ may, as indicated in the rest of this explanation of the prior art, be the result of volume anisotropy of magnetocrystalline origin or induced by elastic growth strains or it may be interface anisotropy due to interfacial electronic interactions. The influence of a layer of platinum in contact with a magnetic layer of cobalt, nickel or iron is a typical case, for example.

When this additional term is present, the perpendicular saturation field can be expressed as follows:

$$H_{sp}=H_{dm}-H_{ap}.$$

Qualitatively, the perpendicular saturation field $H_{sp}$ will therefore reduce uniformly as $H_{ap}$ increases, the magnetization of the magnetic layer always being parallel to the plane until it approaches zero, the limit beyond which, when $H_{ap}$ exceeds $H_{dm}$, magnetization of the magnetic layer will spontaneously (i.e. without any applied magnetic field) be perpendicular to the plane of the layer.

It must also be noted that, in the case of perpendicular anisotropy of interfacial origin, $H_{ap}$ will, as an initial approximation, be inversely proportional to the thickness e of the magnetic layer in accordance with:

$$H_{ap}=C+K_{ap}/e$$

where C is a constant that depends on the volume properties of the magnetic layer and where $K_{ap}$, the perpendicular anisotropy constant, depends on the intimate structure of the material in contact with the magnetic layer and the structural quality of the interface.

This dependence of the perpendicular anisotropy field on the thickness of the magnetic layer therefore indicates that it will only be possible to stabilise magnetization in a direction that is perpendicular to the plane for thin magnetic-layer thicknesses and, conversely, that the critical perpendicular/planar transition thickness increases with the amplitude of $K_{ap}$.

The first object of the invention in relation to applications of the RF oscillator or MRAM memory type is to propose a means of producing a magnetic layer with magnetization perpendicular to the plane of that layer which can be integrated in spin valve or tunnel junction type structures having free and anchored layers with planar magnetization. This additional magnetic layer with perpendicular magnetization is intended to be used as a "polarizer" (see U.S. Pat. No. 6,532,164).

In such a "polarizer", the spin of the current electrons injected into the magnetic system is coupled with magnetization in a direction perpendicular to the plane of the layers and the axis of the magnetization precession cone is therefore also perpendicular to this plane. For weak currents, magnetization of the "free" magnetic layer rotates in a plane that is practically identical to the plane of the layers.

The use of synchronised current pulses and the uniaxial planar magnetic anisotropy of the "free" layer make it possible to reverse the magnetization direction easily by causing it to perform a half precession cycle in the plane of the layer.

The use of such a polarizer in the production of radio-frequency oscillators is also especially sought-after. In such a configuration, the spin-polarized current is injected continuously through the stack rather than as pulses. This being so, the precession motion of the magnetization is sustained rather than resulting in half precession for a write operation in the case of a magnetic memory.

If the magnetization that precesses is that of the free (or soft) layer of a tunnel junction deposited on top of the polarising layer, this precession movement results in oscillating variation of the resistance of the stack due to the tunnel magnetoresistance effect of the junction. This results in the appearance of an oscillating voltage between the two opposite-facing surfaces of the stack, this voltage can be used to produce a tunable radio-frequency oscillator with the frequency being directly related to the intensity of the injected current.

It is important to note that, in order for them to operate, the magnetic layers with perpendicular magnetization must not contain any materials that have a strongly depolarizing effect on the electrons in the vicinity of the active area of the structure.

By way of example, in the case of the perpendicular polarizer mentioned above, inserting a thin layer of platinum between this polarizer and the two magnetic layers of the spin valve or magnetic tunnel junction type structure would completely destroy the polarization of electrons brought about by this polarizer. In the rest of this document, the term "effective" magnetic thickness will be used to denote the thickness of the magnetic layer with perpendicular magnetization, considered relative to the direction of travel of the electrons, beyond any final layer of strongly depolarizing material such as platinum, palladium or gold.

Another object of the invention in relation to MRAM type applications is to propose a means of producing thin magnetic layers that can be integrated in spin valve or magnetic tunnel junction type structures having perpendicular magnetization where the magnetizations of the two active magnetic layers (anchored layer and free layer) are perpendicular to that plane.

A third object of the invention is to propose a means of producing a magnetic layer with planar magnetization, i.e. magnetization located in the plane of the layers that constitute it, for which its demagnetizing field is partially compensated by a perpendicular anisotropy term, thus making it possible to reduce the density of the current required to switch the magnetization of that layer. This magnetic layer may, for instance, be used as a free layer in spin valve or tunnel junction type structures with planar magnetization.

Various methods have been proposed in order to produce thin magnetic layers with magnetization perpendicular to their plane and capable of being used in some of the types of applications mentioned above.

Producing cobalt/nickel multilayers by vapour deposition on a buffer layer of gold covering the substrate has been proposed (Daalderop, Kelly and den Broeder, Physical Review Letters 68, 682, 1992). The operating window is relatively narrow (for example, for a cobalt thickness of 0.4 nm, the nickel layers must be 0.6 to 0.8 nm thick). Not only that, according to the authors, the result obtained depends critically on preparation conditions.

Adopting a similar approach, Ravelosona et al (Physical Review Letters 95, 117203, 2005) have proposed a combination of (cobalt/platinum)/(cobalt/nickel) multilayers, also prepared by vapour deposition. In this case, the effective magnetic thickness (i.e. above the final layer of platinum) is extremely small and equivalent to approximately 1.0 nm of cobalt.

In both these cases it seems necessary to grow the magnetic layers by vapour deposition, a technique that is not very compatible with industrial fabrication. The reason for this is that this perpendicular magnetic anisotropy property is due to the effects of elastic strain between the layers of nickel and cobalt which have crystalline parameters that are slightly different. This explains both the need to use such a preparation technique as well as the difficulty in producing such structures. In any case, any possibility of production on an industrial scale using this technology can be ruled out, at least at acceptable cost. In addition, these elastic strain effects only occur for certain crystalline magnetic materials. There is therefore no possibility, for example, of using other magnetic materials or amorphous magnetic alloys.

U.S. Pat. No. 6,835,646, which deals with structures of the substrate/buffer layer/Ni/FeMn/Cu type, proposes a method whereby growth of the nickel must be epitaxial. This means that the layers that are successively deposited must adopt the symmetry and inter-atomic distance of the underlying layers. In addition, the buffer layer must be made either of monocrystalline copper with crystallographic orientation (002) or diamond with crystallographic orientation (001). This can only be obtained by growth on a monocrystalline silicon substrate with crystallographic orientation (001) and chemical cleaning, moreover, in order to obtain satisfactory orientation of the copper or diamond buffer layer.

This production method is especially onerous to use because of the epitaxial growth and the monocrystalline nature of the substrates. In addition, no magnetic material other than nickel would give the hoped-for result.

Nishimura et al (Journal of Applied Physics 91, 5246, 2002, U.S. Pat. No. 6,844,605) have proposed another production method using structures based on rare earth metals of the GdFeCo/CoFe/Al$_2$O$_3$/CoFe/TbFeCo type, with "effective" thicknesses of magnetic metal (cobalt-iron alloy) of the order of 1 nm.

This production method involves using alloys based on metals in the rare earth family (gadolinium, terbium) that are known to be highly polluting and are prohibited in the industry.

It is evident from the foregoing considerations that none of the proposed solutions can be used to produce, using conventional magnetic materials and a simple preparation method, thin layers with magnetization perpendicular to their plane and having a sufficient "effective" magnetic thickness for the applications in question.

In fact, the magnetic thicknesses that one manages to achieve are either too small to provide exploitable polarization of the electric current that flows at right angles to the plane of the layers or it is necessary to use a specific magnetic material deposited using a very special method in order to achieve larger magnetic thicknesses.

SUMMARY OF THE INVENTION

The invention firstly relates to a thin-film magnetic device comprising, on a substrate, a composite assembly deposited by cathode sputtering and consisting of:

a first layer made of a ferromagnetic material with a high rate of spin polarization, the magnetization of which is in plane in the absence of any electric or magnetic interaction;

a second layer made of a ferromagnetic material with high perpendicular anisotropy, the magnetization of which is outside the plane of said layer in the absence of any electric or magnetic interaction, and coupling of which with said first layer induces magnetization of the device located outside the plane of the layers and/or a decrease in the effective demagnetizing field of the entire device; and a third layer that is in contact with the first layer via its interface opposite to that which is common to the second layer and made of a material that is not magnetic and not polarizing for electrons passing through the device.

The device also comprises means of causing an electric current to flow through it substantially perpendicular to the plane of the layers.

According to the invention, said first layer consists of a magnetic material selected from the group comprising cobalt, iron, nickel or binary alloys thereof such as, for instance, Permalloy Ni$_{80}$Fe$_{20}$, or ternary alloys as well as magnetic, crystallized or amorphous alloys also containing one or more of the magnetic elements cited, and added non-magnetic materials such as, for instance, boron, silicon, phosphorous, carbon, zirconium, hafnium or alloys thereof.

However, this first layer may also consist of a multilayer of the magnetic metal/magnetic metal (e.g. Co/NiFe for instance) or magnetic metal/non-magnetic metal (Co/Cu for instance) type.

Consequently, the thickness of said first layer makes it possible to optimize the spin polarization of an electric current passing through it.

In diffusion mode, the crucial length to produce spin polarization is the spin-diffusion length $l_{SF}$. Spin polarization increases as function $(1-\exp(-e/l_{SF}))$ as a function of the thickness e of said first layer. This spin-diffusion length is typically 4.5 nm at 300 K in Permalloy $Ni_{80}Fe_{20}$, and 20 nm in cobalt. Diffusion mode is the mode encountered, for example, if the polarizer thus produced is separated from the free magnetic layer of a tunnel junction by a metallic or non-magnetic spacer with a view to producing an MRAM cell or a radio-frequency oscillator.

In tunnel mode, the polarization of the tunnel electrons is determined by the electronic state densities in the vicinity of the tunnel barrier. The optimum thickness in order to obtain strong spin polarization is then determined by the thickness of the magnetic layer that is in contact with the barrier which makes it possible to establish strong contrast in electron energy-state densities between spin-up and spin-down electrons close to the Fermi energy in the vicinity of the interface with the tunnel barrier. This thickness is typically several atomic planes and depends on the peak-to-valley height of the interfaces and the materials used. Another point that must be taken into account when determining the thickness of this first layer is the thermal stability of its magnetization. An excessively fine layer (typically a thickness of less than 1 nm) may give rise to thermally activated magnetic fluctuations or even superparamagnetism phenomena that are well known to those skilled in the art.

Generally speaking, the greater the spin polarization, the more the current density required in order to write a memory cell using such a magnetic device or to obtain a radio-frequency oscillator with a wide frequency band can be reduced.

According to the invention, the second layer may consist of an alloy or a multilayer consisting of materials selected from the group comprising cobalt, platinum, iron, nickel, palladium, gold and copper.

The nature, number and thickness of the various elementary layers that constitute said second layer are selected in order to maximize the magnetic perpendicular anisotropy energy of the assembly consisting of the first and second layers in order to obtain the desired characteristics with the maximum thickness of said first layer that is compatible with optimum polarization of the electric current electrons passing through the structure.

According to one advantageous aspect, a so-called "buffer layer" made of one or more materials selected from the group comprising tantalum, chromium, titanium, titanium nitride, copper, gold, palladium, silver and/or alloys thereof is interposed between the magnetic device thus defined and the substrate. This buffer layer is more particularly intended to optimize growth of the first and second layers besides improving their adhesion to each other and to the substrate. It also makes it possible to enhance the flatness of said layers because of the adaptation of lattice parameters that it induces. It can also be used to supply current to the base of the device.

According to the invention, the magnetic device is topped by a third non-magnetic layer made either of metal (for example copper) or an insulator (for example silicon, magnesium or aluminium oxide). The function of this third layer is to protect the magnetic layer of the magnetic device immediately below it against corrosion and it may also be used to supply current to the top of the device. Finally, it also has to magnetically decouple said first magnetic layer from another magnetic layer that is likely to be deposited on top of said third layer, for example in the context of producing a magnetic tunnel junction or a radio-frequency oscillator.

In contrast, this third layer is selected so as not to cause any particular effect in terms of magnetic perpendicular anisotropy or in terms of polarization of the electrons passing through the structure.

According to the invention, production of this magnetic device is achieved by depositing the various layers by cathode sputtering.

This magnetic device can advantageously be used:

as a perpendicular polarizing layer inside spin valves or magnetic tunnel junctions with planar magnetization;

as active layers, i.e. both free layer and anchored layer, in structures with perpendicular magnetization; and as an active layer, i.e. as a free layer with a weak magnetizing field, in structures with planar magnetization.

BRIEF DESCRIPTION OF THE DRAWINGS

For a fuller understanding of the nature and objects of the invention, reference should be made to the following detailed description of a preferred mode of practicing the invention, read in connection with the accompanying drawings in which.

DETAILED DESCRIPTION OF THE INVENTION

Figure 1:
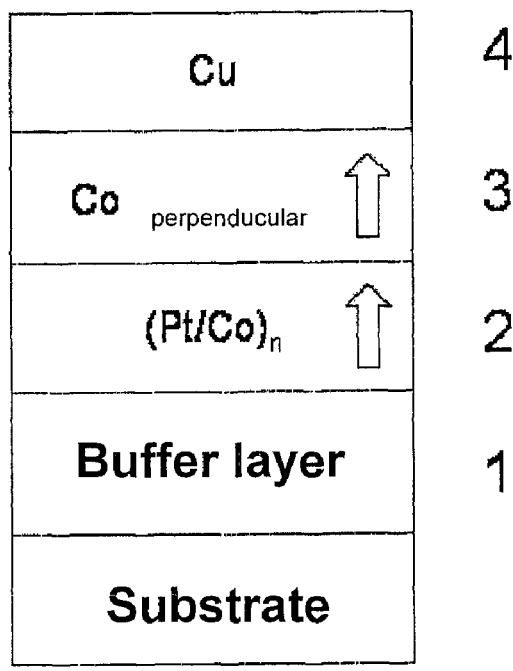
FIG. 1 is a schematic view of a first embodiment of the magnetic device according to the invention.

The reader is first of all reminded of the phenomenon of spin polarization of electrons flowing in devices, especially tunnel junction or spin-valve devices.

An electric current flowing through a conductor consists of electrons, the spin of which has no reason, a priori, to be oriented in any particular direction. Nevertheless, on passing through a magnetic layer having a particular magnetization, the spins of said electrons are oriented by magnetic-moment transfer phenomena so that the electrons have polarized spin when they emerge from this layer.

Such a layer or a set of such layers constitutes a polarizer. This phenomenon may make itself evident in terms of transmission (through a layer) as well as reflection (against certain layers) depending on the direction in which the current flows. It may also make itself evident in the opposite sense in that it allows preferential passage of electrons that have spin-polarized in a certain direction. The function of the layer is then that of an analyzer.

Thus, in the context of magnetic memories that are written by magnetization switching by a spin-polarized current, when the electric current passes through a first so-called anchored layer, it is polarized in the sense that the electron spin tends to align itself with the local magnetization direction. If no strongly depolarizing layer separates this first magnetic layer from a second so called "free" magnetic layer in the sense that it has no particular magnetization orientation, this spin polarization of electrons in return induces precession of the magnetization of said second free magnetic layer around the polarization direction.

In the case of magnetic systems with planar magnetization, if the electric current density passing through these layers increases, the angle of the precession cone increases until it eventually exceeds 90° for a certain critical current, thus causing switching of the magnetization of the "free" layer. However, in order to achieve such flipping, it is necessary to overcome the demagnetizing field of the free layer, the reader being reminded that this demagnetizing field tends to hold magnetization in-plane for thin magnetic layers.

Because this physical unit is proportional to the magnetization of the material, magnetization switching consequently requires the injection of high-density current for conventional magnetic materials, but tunnel junction type magnetic devices are incapable of withstanding such high-density current.

One attraction of the present invention is therefore the use of magnetic devices that, by reducing the demagnetizing field, make it possible to limit these current densities in order, in the context of producing magnetic memories, to optimize their operation.

According to the invention, the magnetic device uses a current substrate which, in particular, is not necessarily monocrystalline. Such a substrate consists, for instance, of silica or oxidized silicon. This oxidation may be the result of thermal oxidation or may be caused by natural oxidation of silicon.

If it is amorphous, this substrate does not induce any preferential crystallographic growth orientation of subsequent layers. It is therefore chosen solely for its known properties such as extremely low peak-to-valley height with a view, in particular, to obtaining satisfactory flatness of upper layers.

Besides silicon and oxidized silicon, this substrate may also consist of other materials that have an extremely low peak-to-valley height such as, for example, silicon nitride or molten glass. It may also be made of alumina or magnesium oxide.

Cathode sputtering is used to deposit a buffer layer 1 on this substrate. As stated above, this buffer layer encourages the growth of upper layers, adapts lattice parameters, ensures wettability of said upper layers, as well as their adhesion and improved flatness. The purpose of this layer is also to make it possible to supply the electric current that flows through the device.

In the first embodiment of the invention, more especially shown in FIG. 1, this buffer layer 1 consists of a thick layer of copper topped by a layer of tantalum and/or platinum. The thickness of the tantalum layer is 2 to 20 nm and advantageously 3 nm. The thickness of the platinum layer is 2 to 30 nm and advantageously 20 nm.

A layer 2, consisting of a stack of layers of platinum and cobalt in a pattern $(Pt/Co)_n$ is then deposited where n is the number of repetitions of the platinum/cobalt stack.

The thickness of the cobalt layers of multilayer 2 $(Co/Pt)_n$ is 0.2 to 1 nm and advantageously 0.6 nm. The thickness of the platinum layers is 0.1 to 2 nm and advantageously roughly 0.3 nm. In addition, the number of repetitions of the stack n (Co/Pt) is 1 to 10.

A layer 3 made of a ferromagnetic material with a high rate of spin polarization is then deposited on this layer 2. In the example described, this layer 3 is made of cobalt. One can, however, advantageously substitute cobalt by another magnetic material known for its propensity to significantly polarize the electron spin of current passing through it, such as, for example, Permalloy $Ni_{80}Fe_{20}$. Another advantage of Permalloy already mentioned previously is its short spin-diffusion length (~4.5 nm) such that, in diffusion mode, a Permalloy thickness of the order of 4.5 nm is sufficient to generate the maximum polarization that can be expected from this material (of the order of 50 to 60%).

This layer 3 can be made of a binary or ternary magnetic alloy of elements selected from the group comprising cobalt, iron and nickel. This alloy may also be crystallized or amorphous and contain added non-magnetic materials selected from the group comprising boron, silicon, phosphorus, carbon, zirconium, hafnium or alloys thereof. This layer 3 may also consist of a magnetic metal/magnetic metal or magnetic metal/non-magnetic metal type multilayer.

This layer 3 has magnetization that is naturally oriented in its plane when it is not coupled with the preceding layer 2.

Finally, a layer of copper 4 having a thickness of 2 to 10 nm is deposited on layer 3, also by cathode sputtering. The ultimate purpose of this layer 4 is to protect layer 3 against corrosion, without inducing any particular effect both in terms of out-of-plane anisotropy of layer 3 and in terms of depolarization of electrons passing through the structure.

This layer 4 is also intended to magnetically decouple layer 3 from other magnetic layers that are likely to be deposited on top of said third layer, such as, for example, adding a tunnel junction with a view to producing an MRAM cell or a radio-frequency oscillator. This layer of copper may also be replaced by a layer of silicon, aluminium or magnesium oxide or of any other material or alloy that does not cause excessive depolarization of electrons.

The purpose of multilayer 2 is, thanks to its high perpendicular magnetic anisotropy, to pull the magnetization of cobalt layer 3 out of plane. To achieve this, it has been demonstrated that the respective thicknesses of these two layers should be selected so that the absolute value of the effective anisotropy of the $(Co/Pt)_n$ multilayer exceeds the absolute value of the effective anisotropy of the cobalt layer.

The following phenomena are described in order to illustrate this statement.

If the magnetization of multilayer 2 is $m_2$, if its thickness is $e_2$ and if the magnetization of cobalt layer 3 and its thickness are $m_3$ and $e_3$ respectively, this gives the following equations:

Firstly, the anisotropy per unit of surface area of each of these two layers is defined as the sum of the magnetocrystalline anisotropy and the interfacial anisotropy. Thus, for layer 2, the effective anisotropy per unit of surface area $k_{eff2}$ is defined by the following equation:

$$k_{eff2} = k_{v2} \cdot e_2 + k_{s2}$$

where $k_{v2}$ and $k_{s2}$ are the magnetocrystalline anisotropy and the interfacial anisotropy respectively of multilayer 2.

Similarly, the following equation applies to cobalt layer 3:

$$k_{\mathit{eff}3}=k_{v3}.e_3+k_{s3}$$

where $k_{v3}$ and $k_{s3}$ are the magnetocrystalline anisotropy and the interfacial anisotropy respectively of the cobalt layer.

Another factor that must be taken into consideration is shape anisotropy which tends to maintain in-plane magnetization of the layer in question in order to minimize magnetostatic energy and is equivalent to the demagnetizing field. Shape anisotropy per unit of surface area is expressed respectively as follows:

for layer 2:

$$-2\pi.M^2_2.e_2;$$

and for layer 3:

$$-2\pi.M^2_3.e_3$$

where $M_{2(3)}$ is the spontaneous magnetization of the corresponding layer.

Finally, A is the exchange coupling constant at the interface between multilayer 2 and cobalt layer 3.

The anisotropy energy per unit of surface area of multilayer 2 is then;

$$E=-[(k_{v2}-2\pi M^2_2)e_2+k_{s2}]\cos^2\theta_2$$

where $\theta_2$ is the magnetization angle of layer 2 relative to the direction that is perpendicular to the plane of the layers.

As a result of this expression, in order to make sure that layer 2 has resultant out-of-plane magnetization in the absence of interaction with any other layer, one must check the relation $[(k_{v2}-2\pi.M^2_2)e_2+k_{s2}]\gg0$, so that energy $[(k_{v2}-2\pi.M^2_2)e_2+k_{s2}]\cos^2\theta_2$ is minimized for $\theta_2=0$, i.e. for out-of-plane magnetization.

To achieve this, the thickness of multilayer 2 must be sufficiently small (i.e. the number of repetitions n in particular) for shape anisotropy not to reduce interfacial perpendicular anisotropy excessively.

Experience demonstrates, however, that this material—the cobalt/platinum multilayer in the example described—produces excessively weak spin polarization; any polarization obtained when electrons pass through a cobalt layer is practically lost when they pass through the next platinum layer. In order to increase this polarization, this multilayer is coupled with a thicker layer of magnetic metal which, in a known manner, has strong spin polarization.

In fact, the cobalt mentioned in the example can advantageously be replaced, as was stated above, by a Permalloy $Ni_{80}Fe_{20}$ or cobalt-iron CoFe alloy. However, the magnetization direction of these materials, in the absence of coupling with layer 2 and parallel to the plane, is in accordance with the following expression:

$$[(k_{v3}-2\pi M^2_3)e_3+k_{s3}]<0.$$

But exchange coupling between the magnetization of layers 2 and 3, in accordance with the expression—A cos ($\theta_2-\theta_3$), in which $\theta_2$ and $\theta_3$ are the respective magnetization angles of each of the two layers relative to the direction that is perpendicular to the plane of the layers, tends to keep the magnetization of said layers parallel to each other.

Thus, the magnetic energy produced by stacking these two coupled layers 2 and 3 is defined by the following relation:

$$E=-[(k_{v2}-2\pi M^2_2)e_2+k_{s2}]\cos^2\theta_2-[(k_{v3}-2\pi M^2_3)e_3+k_{s3}]\cos^2\theta_3-A\cos(\theta_2-\theta_3).$$

This being so, in order for the cobalt/platinum multilayer 2 to pull the magnetization of the cobalt or permalloy layer 3 out of plane, two conditions must be met.

Firstly, the effective out-of-plane anisotropy of layer 2 must be stronger than the effective planar anisotropy of layer 3 which is expressed by:

$$[(k_{v2}-2\pi M^2_2)e_2+k_{s2}]+[(k_{v3}-2\pi M^2_3)e_3+k_{s3}]>0.$$

Also, within the framework of the simple model presented here consisting of two layers coupled by coupling constant A and with out-of-plane anisotropy for layer 2 and planar anisotropy for layer 3 respectively, it will be possible for the magnetization of layer 3 to be pulled out of plane by the effect of coupling with layer 2 provided that the coupling energy per unit of surface area is twice the absolute value of the effective anisotropy of layer 3 per unit of surface area.

In the case of layer 3 (cobalt or permalloy), the greater its thickness $e_3$, the asymptotically higher its polarization, especially in relation to the spin-diffusion length in diffusion mode. Nevertheless, this thickness must not assume an excessively high value capable of reducing its in-plane magnetization once the layers have been assembled.

Figure 2:
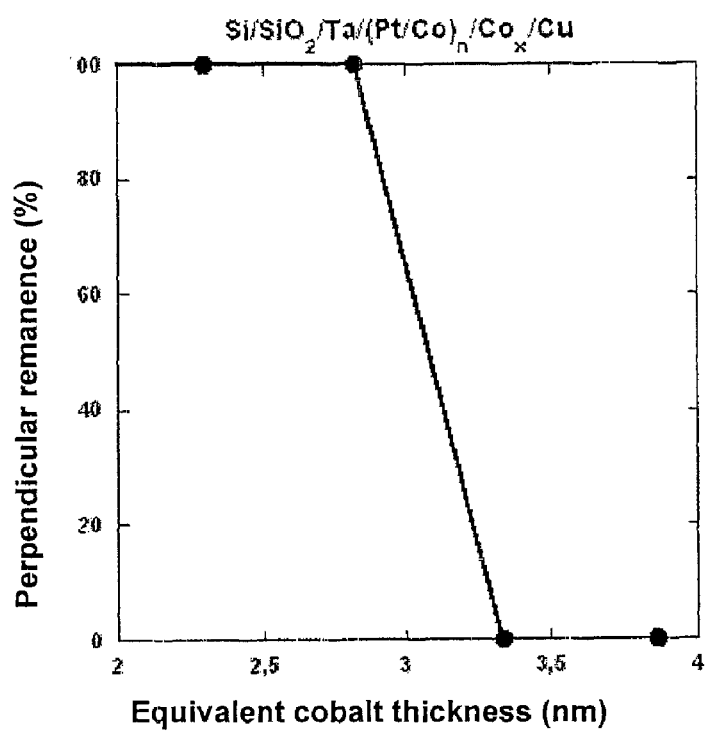
FIG. 2 is a graph showing the variation in remanent magnetization measured in the perpendicular field as a function of the equivalent cobalt thickness for structures of the type shown in FIG. 1.

FIG. 2 shows, for such a structure, typically consisting of an $Si/SiO_2/Ta/(Pt/Co)_n/Co_x/Cu$ stack, the variation in remanent magnetization, measured with a magnetic field applied perpendicular to the plane of the layers, as a function of the cobalt thickness measured from the last platinum layer.

Note that 100% remanent magnetization in a zero field, corresponding to the characteristic whereby magnetization of the cobalt layer is perpendicular to the plane of the layers, persists for cobalt thicknesses approaching 2.8 nm. Consequently, there is 0% remanent magnetization indicating that magnetization of the cobalt layer is parallel to the plane of the layers for a cobalt thickness exceeding 3 nm.

In the configuration of this first embodiment and for cobalt thicknesses less than 3 nm, one can therefore produce a perpendicular polarizer as referred to in the introduction.

Figure 3:
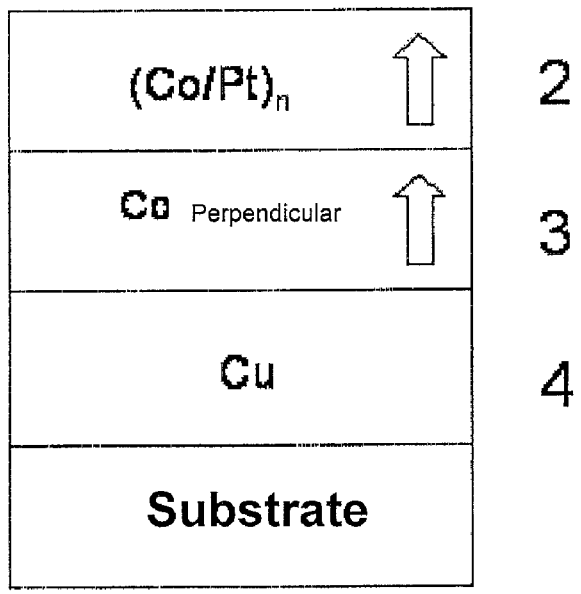
FIG. 3 is a schematic view of a second embodiment of the invention.

In a second embodiment, shown in FIG. 3, the structure described in the preceding example is reversed, giving a succession of substrate/copper/cobalt (ferromagnetic material)/multilayer $(Co/Pt)_n$. This embodiment is symmetrical with the preceding embodiment, "effective" cobalt layer 3 now being located, in terms of the sequence in which the various layers are deposited, underneath cobalt/platinum multilayer 2.

The thickness of the cobalt layers of cobalt/platinum multilayer 2 is 0.2 to 1 nm and advantageously 0.6 nm.

The thickness of the platinum layers of cobalt/platinum multilayer 2 is 0.2 to 2 nm and advantageously 1.6 nm.

The number of repetitions of the cobalt/platinum stack is 1 to 10 and advantageously 5.

Figure 4:
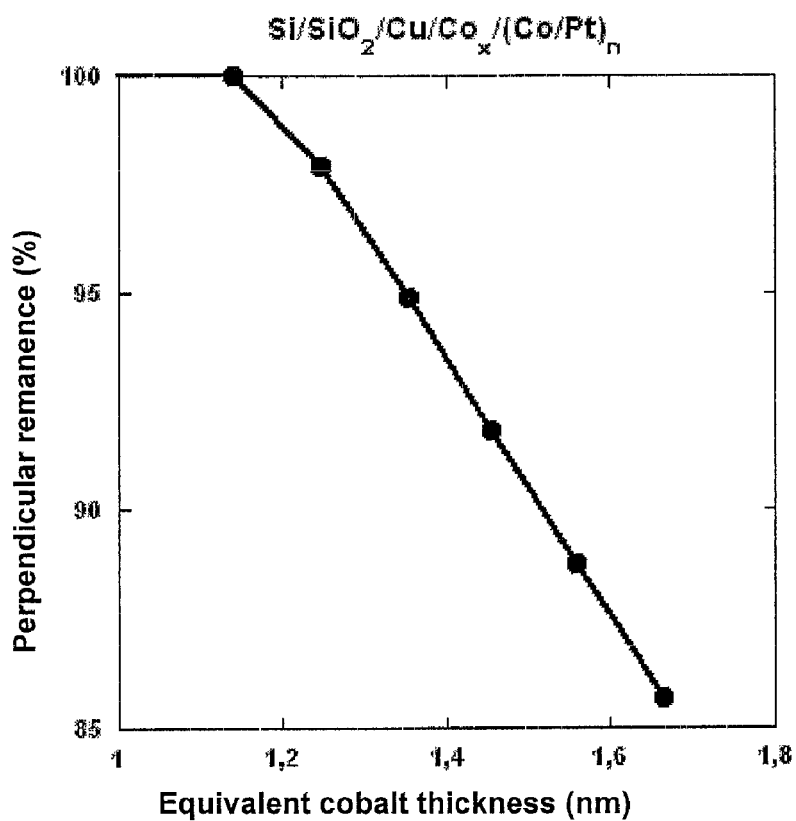
FIG. 4 is a graph showing the variation in remanent magnetization (measured in the perpendicular field) as a function of the equivalent cobalt thickness for the structures shown in FIG. 3.

FIG. 4 shows, for such a structure, more particularly the $Cu/Co/(Co_{0.6}/Pt_{1.6})_5/Pt$ structure, the variation in remanent magnetization, measured with a magnetic field applied perpendicular to the plane of the layers, as a function of the cobalt thickness.

Note that there is 100% remanent magnetization in a zero field corresponding to magnetization of "effective" cobalt layer 3 perpendicular to the plane of the layers for cobalt thicknesses less than 1.2 nm.

Consequently, there is less than 100% remanent magnetization indicating that a part of magnetization of the magnetic layers is parallel to the plane of the layers for cobalt thicknesses exceeding 1.2 nm.

Figure 5:
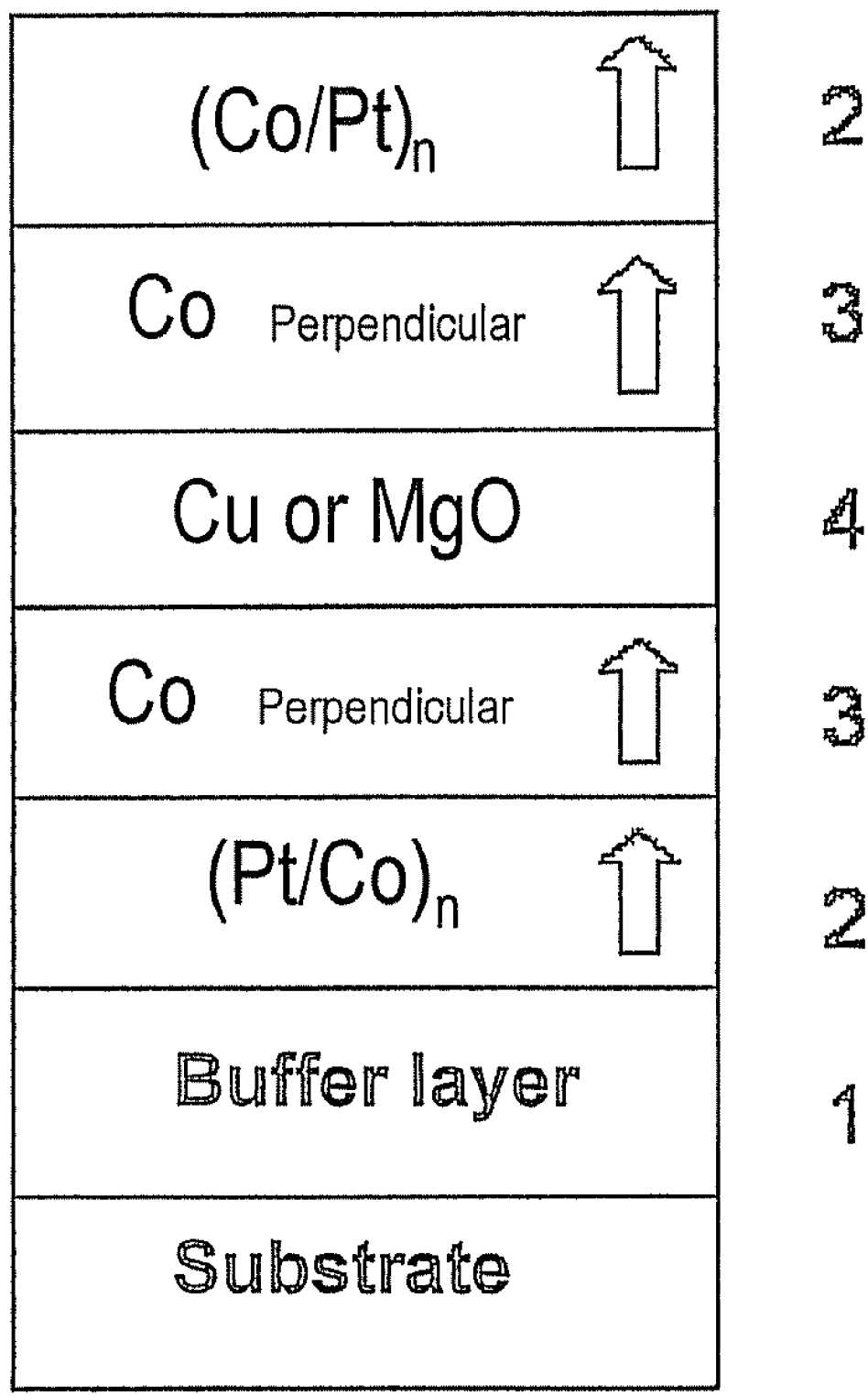
FIG. 5 is a schematic view of a third embodiment of the invention.

In a third embodiment, one can, by combining the above two embodiments, produce a complete structure of the "spin valve" or "magnetic tunnel junction" type in particular with perpendicular magnetization, as shown schematically in FIG. 5 in which each of the "active" magnetic layers of the junction or spin valve is produced according to one of the first two embodiments. If one wants to produce an MRAM magnetic memory, the structures of the first and of the second embodiment will be separated, for example, by a non-magnetic conductive layer or a tunnel barrier of the $Al_2O_3$ or MgO type.

Figure 6:
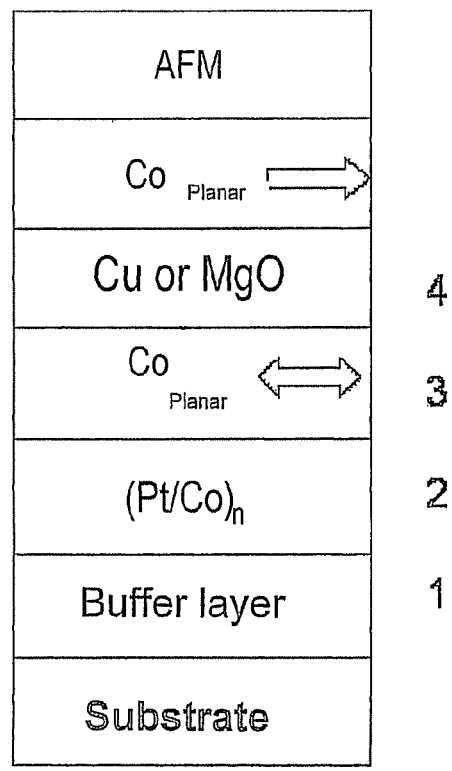
FIG. 6 is a schematic view of a fourth embodiment of the invention.

In a fourth embodiment shown in FIG. 6, one uses the stack shown in the first embodiment, but this time as a "free layer" in a structure of the spin valve or tunnel junction type with planar magnetization. The so-called "anchored" layer can have the usual structure, namely a traditional magnetic material, for example, with planar magnetization which is exchange coupled with an antiferromagnetic material (AFM).

Figure 7:
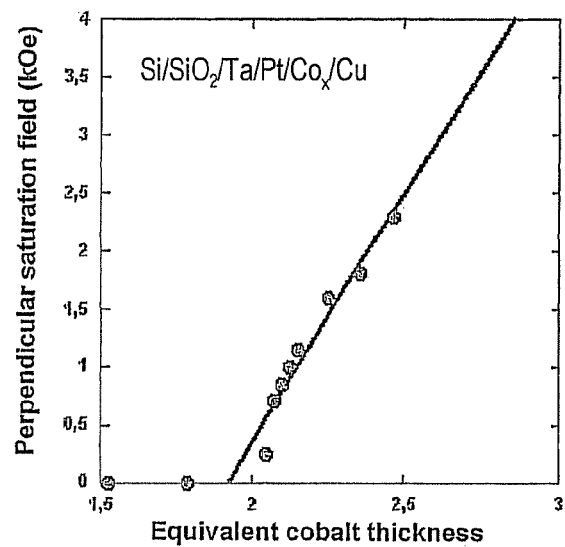
FIG. 7 is a graph showing the variation in the saturation field (measured in the perpendicular field) as a function of the equivalent cobalt thickness that constitutes the free layer of the structure of the type shown in FIG. 6.

For a stack of the type shown in FIG. 6, FIG. 7 shows the variation in the saturation field (the magnetic field is always applied in a direction perpendicular to the plane of the layers) as a function of the cobalt thickness (layer 3). This saturation field shows the intensity of the magnetic field required in order to force magnetization of the cobalt, which is naturally parallel to the plane of the layer for thicknesses in excess of approximately 2 nm in accordance with FIG. 6, to orient itself in a direction perpendicular to the plane.

One can see that the saturation field values are much less than those which would be required (of the order of 18 kOe) in the case of a cobalt layer of the same thickness in the absence of the perpendicular anisotropy term introduced by interaction between layer 2 and magnetic layer 3.

In other words, this graph shows the reduction in the perpendicular saturation field when the cobalt thickness is reduced, especially when reduced down to thicknesses of the order of 2 nm. If one wants to obtain a layer with planar magnetization but a weak demagnetizing field, i.e. in the context of using the magnetic device according to the invention in relation to magnetic memories in which magnetization switching is performed by using a spin-polarized current, one will therefore choose a cobalt thickness slightly in excess of 2 nm for the example described here.

Figure 8:
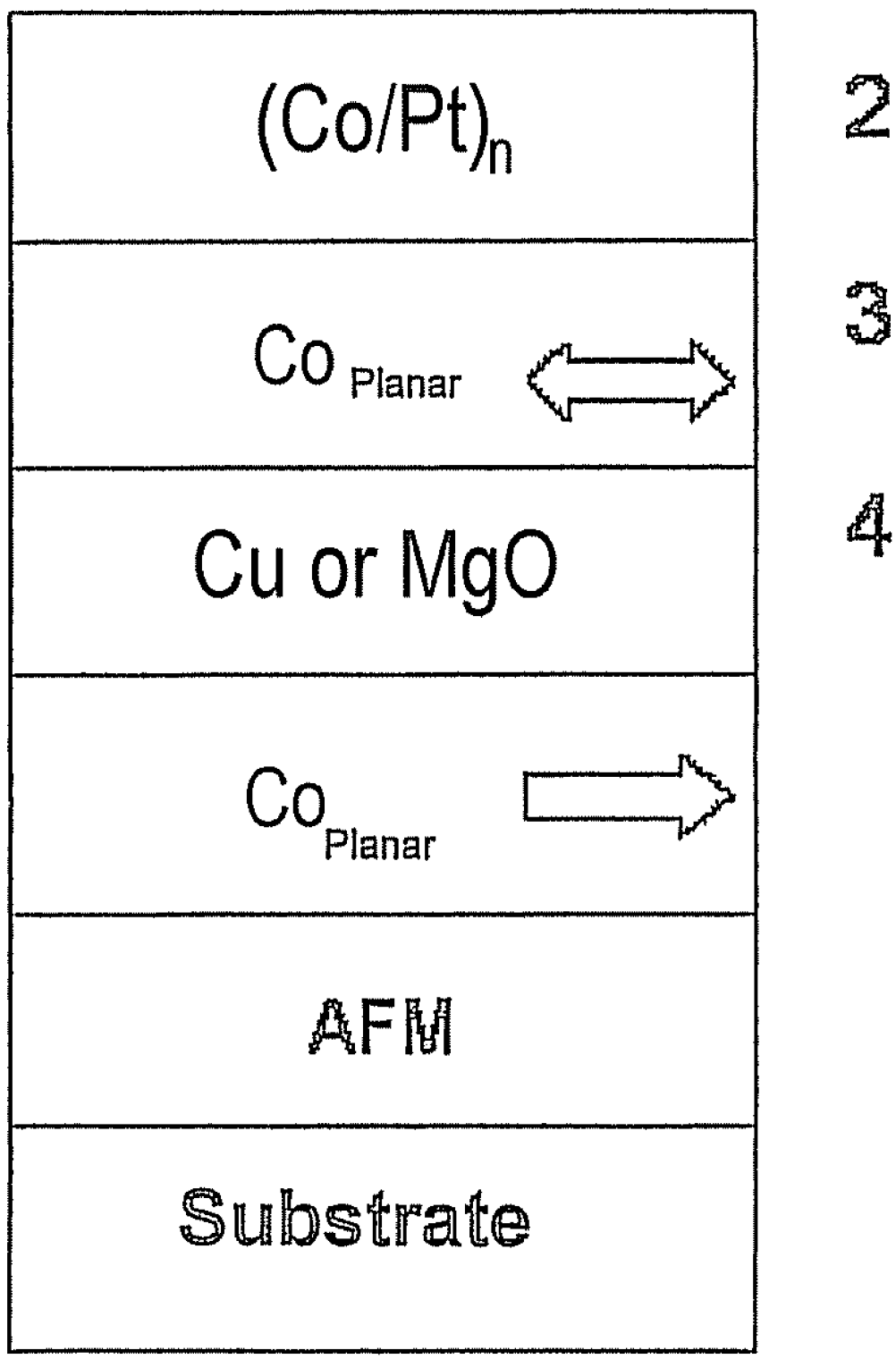
FIG. 8 is a schematic view of a fifth embodiment of the invention.

In a fifth embodiment shown in FIG. 8, one uses the stack shown in the second embodiment, but this time as a "free layer" in a structure of the spin valve or tunnel junction type with planar magnetization. The so-called "anchored" layer can have the usual structure, namely a traditional magnetic material, for example, with planar magnetization which is exchange coupled with an antiferromagnetic material (AFM).

As in the case of the fourth embodiment, this will therefore give a free layer with planar magnetization but a weak demagnetizing field, this free layer being, in this embodiment, located above the anchored layer in terms of the sequence in which the various layers of the device are deposited.

What is claimed:

1. A thin-film magnetic device comprising a substrate, a composite assembly deposited by cathode sputtering comprising:
    a first magnetic layer made of a material with a positive effective anisotropy, the magnetization of which is oriented perpendicular to the plane of said layer and the positive effective anisotropy per unit of surface area k2 including bulk and interfacial contributions is $[(k_{v2}-2\pi M^2_2)e_2+k_{s2}]$ where:
        $k_v$ is a volume anisotropy of the first magnetic layer;
        M is the magnetization of the first magnetic layer;
        $e_2$ is the thickness of the first magnetic layer; and
        $k_{s2}$ is the interfacial anisotropy of the first magnetic layer;
    a second magnetic layer made of a material with a negative effective anisotropy, the negative effective k3 anisotropy per unit of surface area k3 including bulk density and interfacial contributions is $[(k_{v3}-2\pi M^2_3)e_3+k_{s3}]$ where:
        $k_{v3}$ is a volume anisotropy of the second magnetic layer;
        M is the magnetization of the second magnetic layer;
        $e_3$ is the thickness of the second magnetic layer; and
        $k_{s3}$ is the interfacial anisotropy of the second magnetic layer;
    said second magnetic layer having a spin polarization of at least 50%, wherein the second magnetic layer spin polarizes electrons traversing through the second magnetic layer when an electrical current flows perpendicular to the plane of the second magnetic layer; and
    a third non-magnetic layer, in direct contact with the second magnetic layer on its interface opposite to the interface with the first magnetic layer and made of a material that is not depolarizing for electrons passing through the third non-magnetic layer,
    wherein a coupling energy per unit of surface area between the first magnetic layer and the second magnetic layer is at least twice the absolute value of the effective negative anisotropy per unit of surface area of the second magnetic layer, and the sum of the effective magnetic anisotropy values k2+k3 is positive, and
    wherein the first magnetic layer is anchored and said device comprises means of causing an electric current to flow through its layers in a direction substantially perpendicular to the plane of said layers.

2. A thin-film magnetic device according to claim 1, wherein the layer made of a material with the positive effective anisotropy comprises a material, an alloy or a multilayer of materials selected from the group consisting of cobalt, platinum, iron, nickel, palladium, gold and copper.

3. A thin-film magnetic device according to claim 1, wherein the magnetic layer made of a ferromagnetic material with the spin polarization of at least 50% comprises a magnetic material selected from the group consisting of cobalt, iron, nickel or binary or ternary alloys thereof.

4. A thin-film magnetic device according to claim 1, wherein the magnetic material that constitutes the layer of a ferromagnetic material with the spin polarization of at least 50% is crystallized or amorphous and contains added non-magnetic materials selected from the group consisting of boron, silicon, phosphorus, carbon, zirconium, hafnium or alloys thereof.

5. A thin-film magnetic device according to claim 1, wherein the layer of a ferromagnetic material with the spin polarization of at least 50% comprising a multilayer of the magnetic metal/magnetic metal or magnetic metal/non-magnetic metal type.

6. A thin-film magnetic device according to claim 1, wherein the third non-magnetic layer is made of a non-magnetic metal or a non magnetic oxide.

7. A thin-film magnetic device according to claim 1, wherein a buffer layer is interposed between the substrate and the composite assembly made of the three layers.

8. A thin-film magnetic device according to claim 7, wherein the buffer layer is made of one or more materials selected from the group consisting of platinum, tantalum, chromium, titanium, titanium nitride, copper, gold, palladium, silver or alloys thereof.

9. A thin-film magnetic device according to claim 7, wherein the buffer layer comprises a plurality of layers.

10. A thin-film magnetic device according to claim 1, wherein the substrate is made of a material selected from the group consisting of silicon, silica, silicon nitride, magnesium oxide, alumina and glass.

11. A magnetic tunnel junction with planar magnetization further comprising two active magnetic layers and the magnetic device according to claim 1.

12. A magnetic tunnel junction with planar magnetization comprising two active magnetic layers, wherein at least one of the two active magnetic layers comprises the magnetic device according to claim 1.

13. A magnetic tunnel junction with perpendicular magnetization comprising two active magnetic layers, wherein at least one of the two active magnetic layers comprises the magnetic device according to claim 1.

14. A spin valve with planar magnetization further comprising two active magnetic layers and the magnetic device according to claim 1.

15. A spin valve with planar magnetization comprising two active magnetic layers, wherein at least one of its two active magnetic layers comprises the magnetic device according to claim 1.

16. A spin valve with perpendicular magnetization comprising two active magnetic layers, wherein at least one of its two active magnetic layers comprises the magnetic device according to claim 1.

* * * * *

UNITED STATES PATENT AND TRADEMARK OFFICE
CERTIFICATE OF CORRECTION

PATENT NO. : 7,813,202 B2  
APPLICATION NO. : 11/833336  
DATED : October 12, 2010  
INVENTOR(S) : Bernard Rodmacq and Bernard Dieny Page 1 of 1

It is certified that error appears in the above-identified patent and that said Letters Patent is hereby corrected as shown below:

In the Claims:

Column 13, Claim 1

Line 54: please change "comprising" to --on--

Line 63: please change "$k_v$" to -- $k_{v2}$--

Line 64: please change "M" to --$M_2$--

Column 14, Claim 1

Line 2: please delete "k3"

Line 3: please add --,-- after "area" and after "k3"

Line 6: please change "M" to -- $M_2$--

Column 14, Claim 3

Line 37: please change "comprises" to --comprising--

Signed and Sealed this  
Twenty-fifth Day of January, 2011

David J. Kappos  
*Director of the United States Patent and Trademark Office*